United States Patent
Li

(10) Patent No.: US 9,497,504 B2
(45) Date of Patent: Nov. 15, 2016

(54) METHOD FOR ENHANCING FAST BACKWARD PERFORMANCE AND ASSOCIATED ELECTRONIC DEVICE

(75) Inventor: Xiangrong Li, Beijing (CN)

(73) Assignee: Silicon Motion Inc., Hsinchu County (TW)

( * ) Notice: Subject to any disclaimer, the term of this patent is extended or adjusted under 35 U.S.C. 154(b) by 931 days.

(21) Appl. No.: 12/688,915

(22) Filed: Jan. 18, 2010

(65) Prior Publication Data

US 2011/0137901 A1 Jun. 9, 2011

(30) Foreign Application Priority Data

Dec. 9, 2009 (TW) ................ 98142043 A

(51) Int. Cl.
| | |
|---|---|
| G06F 7/00 | (2006.01) |
| H04N 21/44 | (2011.01) |
| G11C 16/26 | (2006.01) |
| H04N 21/432 | (2011.01) |
| H04N 21/845 | (2011.01) |

(52) U.S. Cl.
CPC ......... *H04N 21/44004* (2013.01); *G11C 16/26* (2013.01); *H04N 21/4325* (2013.01); *H04N 21/8455* (2013.01)

(58) Field of Classification Search
CPC ............ G06F 17/2229; G06F 17/30091; G06F 17/30858; G06F 17/211; G06F 17/30011; Y10S 707/99943; H04N 21/4331
USPC ......... 707/913, 999.107, 725, 736–737, 812; 386/216–220, 248, 262, 288; 715/202, 715/255; 717/174–177; 375/240.15–16; 345/421
See application file for complete search history.

(56) References Cited

U.S. PATENT DOCUMENTS

| | | | | |
|---|---|---|---|---|
| 5,832,525 | A * | 11/1998 | Wong et al. | |
| 6,766,056 | B1 * | 7/2004 | Huang et al. | ................ 382/190 |
| 6,832,293 | B1 * | 12/2004 | Tagawa et al. | ............... 711/115 |
| 7,747,625 | B2 * | 6/2010 | Gargi | ............... G06F 17/30274 |
| | | | | 707/705 |
| 7,889,964 | B1 * | 2/2011 | Barton et al. | ................ 386/241 |
| 8,068,723 | B2 * | 11/2011 | Okada et al. | ................ 386/336 |
| 8,489,598 | B2 * | 7/2013 | Rhoads | ................... G06F 3/017 |
| | | | | 707/736 |
| 2001/0036355 | A1 * | 11/2001 | Kelly | ................... G11B 27/034 |
| | | | | 386/290 |
| 2002/0037160 | A1 * | 3/2002 | Locket et al. | ................ 386/111 |
| 2003/0093611 | A1 * | 5/2003 | Schulze et al. | ............... 711/103 |
| 2003/0185393 | A1 * | 10/2003 | Kii et al. | ..................... 380/201 |

(Continued)

FOREIGN PATENT DOCUMENTS

TW 200935905 8/2009

*Primary Examiner* — Alex Gofman
*Assistant Examiner* — Linh Black
(74) *Attorney, Agent, or Firm* — Winston Hsu; Scott Margo

(57) ABSTRACT

A method for enhancing fast backward performance includes: with regard to a plurality of offsets of a multimedia file, respectively storing corresponding cluster numbers into a first buffering region/buffer, where the offsets respectively correspond to different playback time points, and the cluster numbers respectively represent a plurality of clusters belonging to the multimedia file; and utilizing at least one portion of the offsets and the cluster numbers to perform a fast backward operation of the multimedia file. An associated electronic device is further provided.

10 Claims, 6 Drawing Sheets

(56) References Cited

U.S. PATENT DOCUMENTS

| | | |
|---|---|---|
| 2006/0015681 A1* | 1/2006 | Park .............................. 711/112 |
| 2006/0127079 A1* | 6/2006 | Sasaki ........................... 396/105 |
| 2008/0292270 A1* | 11/2008 | Ikeda ...................... G06F 9/445 386/248 |
| 2009/0003447 A1* | 1/2009 | Christoffersen et al. ........................ 375/240.16 |
| 2009/0080864 A1* | 3/2009 | Rajakarunanayake .. H04N 5/76 386/200 |
| 2009/0240967 A1* | 9/2009 | Good .................... G06F 1/3203 713/323 |
| 2010/0064145 A1* | 3/2010 | Hirota et al. ................. 713/193 |

* cited by examiner

METHOD FOR ENHANCING FAST BACKWARD PERFORMANCE AND ASSOCIATED ELECTRONIC DEVICE

BACKGROUND OF THE INVENTION

1. Field of the Invention

The present invention relates to playback control of multimedia files, and more particularly, to a method for enhancing fast backward performance, and to an associated electronic device.

2. Description of the Prior Art

As technologies of Flash memories progress in recent years, many kinds of portable memory devices (e.g. memory cards respectively complying with SD/MMC, CF, MS, and XD standards) or portable multimedia players equipped with Flash memories (e.g. MP3 players or portable audio/video players) are widely implemented in various applications. Therefore, the control of access to Flash memories in these portable devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. Although there are some solutions proposed by the related art in response to these problems, it seems unlikely that the related art gives consideration to both operation performance and system resource management. As a result, no matter which solution is chosen, a corresponding side effect typically exists.

In addition, as hardware resources are limited within these portable devices such as the portable multimedia players mentioned above, slow response problems of fast backward operations for huge multimedia files may occur. More particularly, when performing fast backward operations according to the related art, it is typically required to search starting from the beginning of a multimedia file through to a target location thereof, causing the need of a long time wait and a large storage space for buffering, and further causing additional power consumption due to many additional read operations. Thus, a novel method is required for enhancing the control of data access of a Flash memory, in order to give consideration to both operation performance and system resource management.

SUMMARY OF THE INVENTION

It is therefore an objective of the claimed invention to provide a method for enhancing fast backward performance, and to provide an associated electronic device, in order to solve the above-mentioned problems.

According to a preferred embodiment of the claimed invention, a method for enhancing fast backward performance comprises: with regard to a plurality of offsets of a multimedia file, respectively storing corresponding cluster numbers into a first buffering region/buffer, wherein the offsets respectively correspond to different playback time points, and the cluster numbers respectively represent a plurality of clusters belonging to the multimedia file; and utilizing at least one portion of the offsets and the cluster numbers to perform a fast backward operation of the multimedia file.

While the method mentioned above is disclosed, an associated electronic device is further provided. The electronic device comprises: at least one buffer memory comprising a first buffering region/buffer; and a controller arranged to execute a program code to control operations of the electronic device, wherein with regard to a plurality of offsets of a multimedia file, the controller respectively stores corresponding cluster numbers into the first buffering region/buffer. In addition, wherein the offsets respectively correspond to different playback time points, and the cluster numbers respectively represent a plurality of clusters belonging to the multimedia file. Additionally, the controller utilizes at least one portion of the offsets and the cluster numbers to perform a fast backward operation of the multimedia file.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
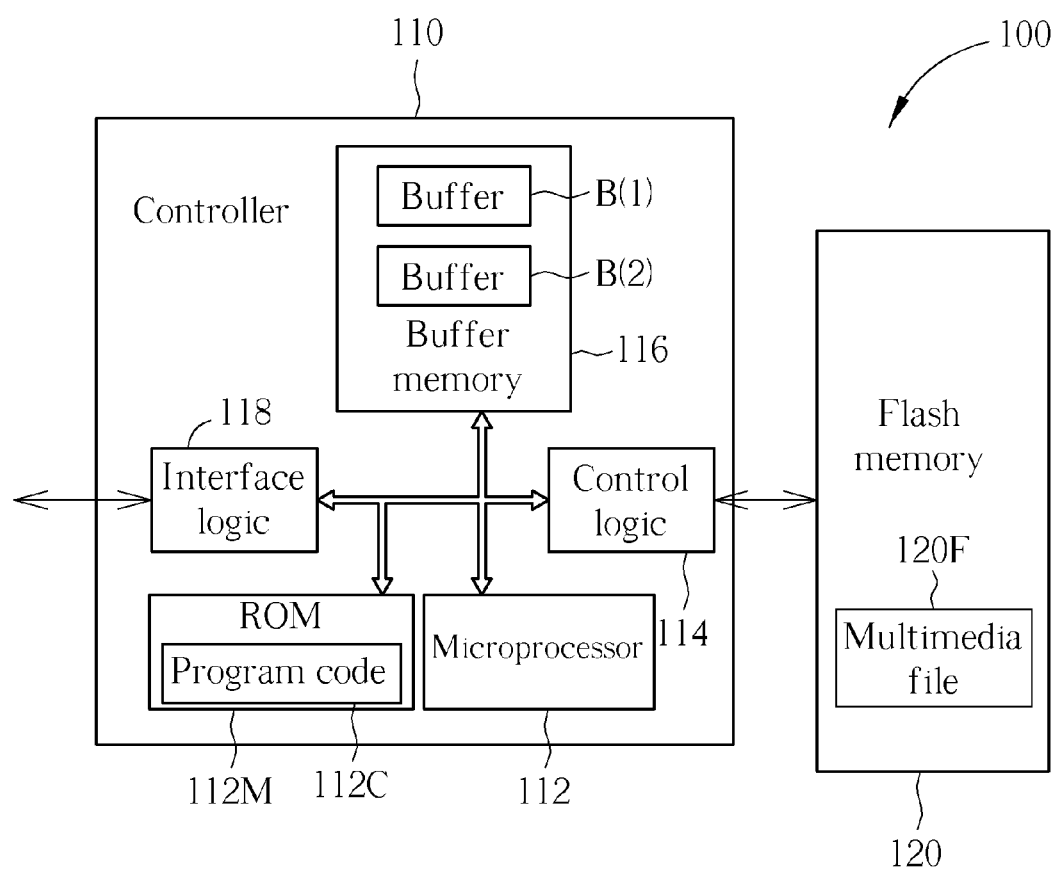
FIG. 1 is a diagram of an electronic device according to a first embodiment of the present invention.

Please refer to FIG. 1, which illustrates a diagram of an electronic device 100 according to a first embodiment of the present invention. In particular, the electronic device 100 of this embodiment can be a portable electronic device such as a portable multimedia player (e.g. an MP3 player or a portable audio/video player). The electronic device 100 comprises a controller 110 and a Flash memory 120, where the controller 110 is arranged to execute a program code 112C to control operations of the electronic device 100 (e.g. operations of accessing the Flash memory 120 and playing multimedia files), and the Flash memory 120 is arranged to store information such as various kinds of files (e.g. multimedia files). According to this embodiment, the controller 110 comprises a microprocessor 112, a read only memory (ROM) 112M, a control logic 114, at least one buffer memory 116, and an interface logic 118. Here, the buffers B(1) and B(2) may represent different buffering regions within the buffer memory 116, or represent buffers having respective physical architecture within the buffer memory 116. In addition, the ROM 112M is arranged to store the program code 112C, and the microprocessor 112 is arranged to execute the program code 112C to control the operations of the electronic device 100. Please note that, according to different variations of this embodiment, the program code 112C can be stored in the buffer memory 116 or any other memory.

Typically, the Flash memory 120 comprises a plurality of blocks, and the controller (e.g. the controller 110 that executes the program code 112C by utilizing the microprocessor 112) performs data erasure operations on the Flash memory 120 by erasing in units of blocks. In addition, a block can be utilized for recording a specific amount of pages, where the controller mentioned above performs data writing operations on the Flash memory 120 by writing/programming in units of pages.

In practice, the controller 110 that executes the program code 112C by utilizing the microprocessor 112 is capable of performing various control operations by utilizing the internal components within the controller 110. For example, the controller 110 utilizes the control logic 114 to control access to the Flash memory 120 (e.g. operations of accessing at least one block or at least one page), utilizes the buffer memory 116 to perform buffering operations for the controller 110, and utilizes the interface logic 118 to communicate with a host device.

According to this embodiment, the controller 110 executing the program code 112C can properly utilize the buffer memory 116 to enhance fast backward performance. More specifically, the controller 110 can utilize a first buffering region/buffer within the buffer memory 116, such as the buffer B(1), to store clusters numbers, and further utilize a second buffering region/buffer within the buffer memory 116, such as the buffer B(2), to temporarily store clusters represented by the cluster numbers in turns, and can properly utilize at least one portion of the offsets and the cluster numbers (e.g. at least one portion of the offsets and/or at least one portion of the cluster numbers) to manage the associated operations in order to enhance the performance of fast backward operations of various kinds of multimedia files. Please note that the multimedia files can be stored in the Flash memory 120. This is for illustrative purposes only, and is not meant to be a limitation of the present invention. According to some variations of this embodiment, the Flash memory 120 can be replaced by other storage module(s)/component(s) such as hard disk (HD) module(s)/HD drive(s). No matter whether the Flash memory 120 is replaced by other storage module(s)/component(s) or not, the electronic device 100 can properly utilize the buffer memory 116 to enhance the fast backward performance, and even the fast forward performance. Related details are described by referring to FIG. 2.

Figure 2:
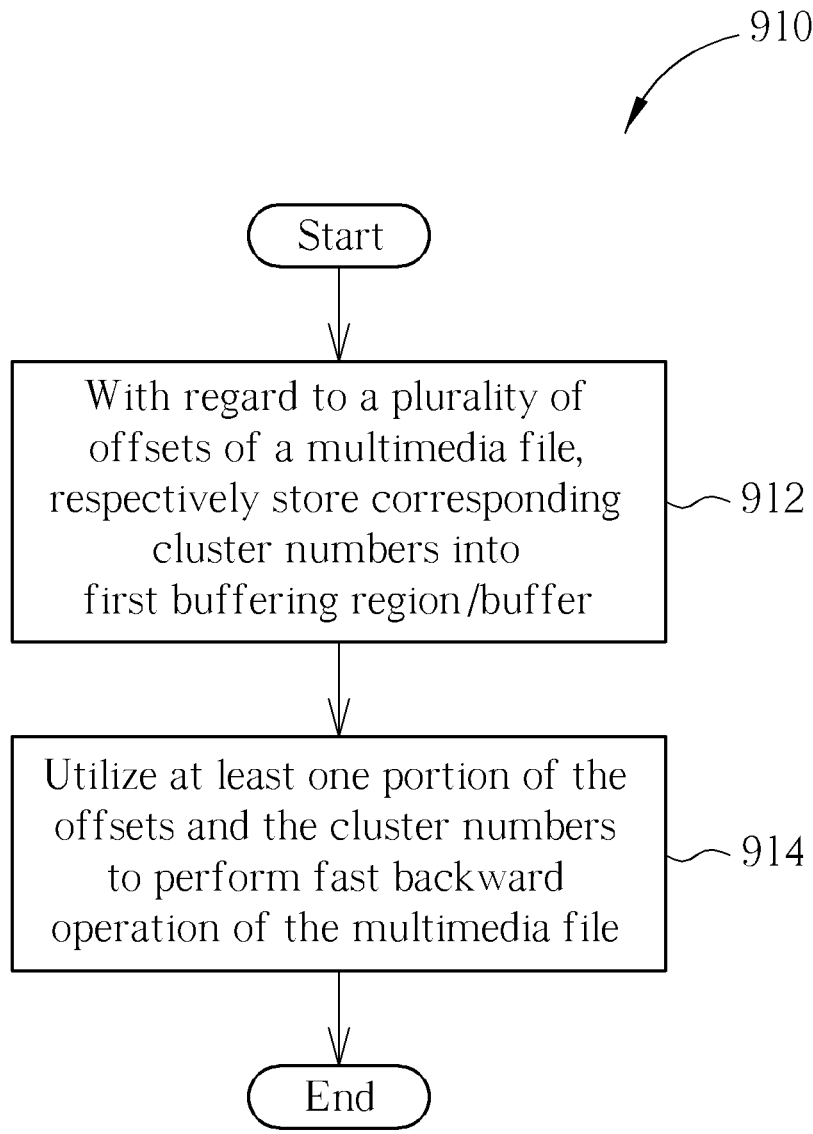
FIG. 2 is a flowchart of a method for enhancing fast backward performance according to an embodiment of the present invention.

FIG. 2 is a flowchart of a method 910 for enhancing fast backward performance according to an embodiment of the present invention. The method can be applied to the electronic device 100 shown in FIG. 1, and more particularly, to the controller 110 executing the program code 112C. In addition, the method can be implemented by utilizing the electronic device 100 shown in FIG. 1, and more particularly, by utilizing the controller 110 executing the program code 112C. The method 910 is described as follows.

In Step 912, with regard to a plurality of offsets Off(n) of a multimedia file 120F, the controller 110 respectively stores corresponding cluster numbers c(n) into the first buffering region/buffer such as the buffer B(1), wherein the offsets Off(n) respectively correspond to different playback time points, and the cluster numbers c(n) respectively represent a plurality of clusters C(n) belonging to the multimedia file 120F. Here, n is an integer and varies within at least a portion of a predetermined range (e.g. the interval [0, N]). More particularly, during performing a playback operation of the multimedia file 120F or a fast forward operation of the multimedia file 120F, the controller 110 can temporarily store the clusters C(n) into the second buffering region/buffer such as the buffer B(2) in turns. In addition, during performing the playback operation or the fast forward operation mentioned above, with regard to the offsets Off(n), the controller 110 respectively stores the corresponding cluster numbers c(n) into the first buffering region/buffer such as the buffer B(1), in order to establish a database for looking up.

Figure 3A:
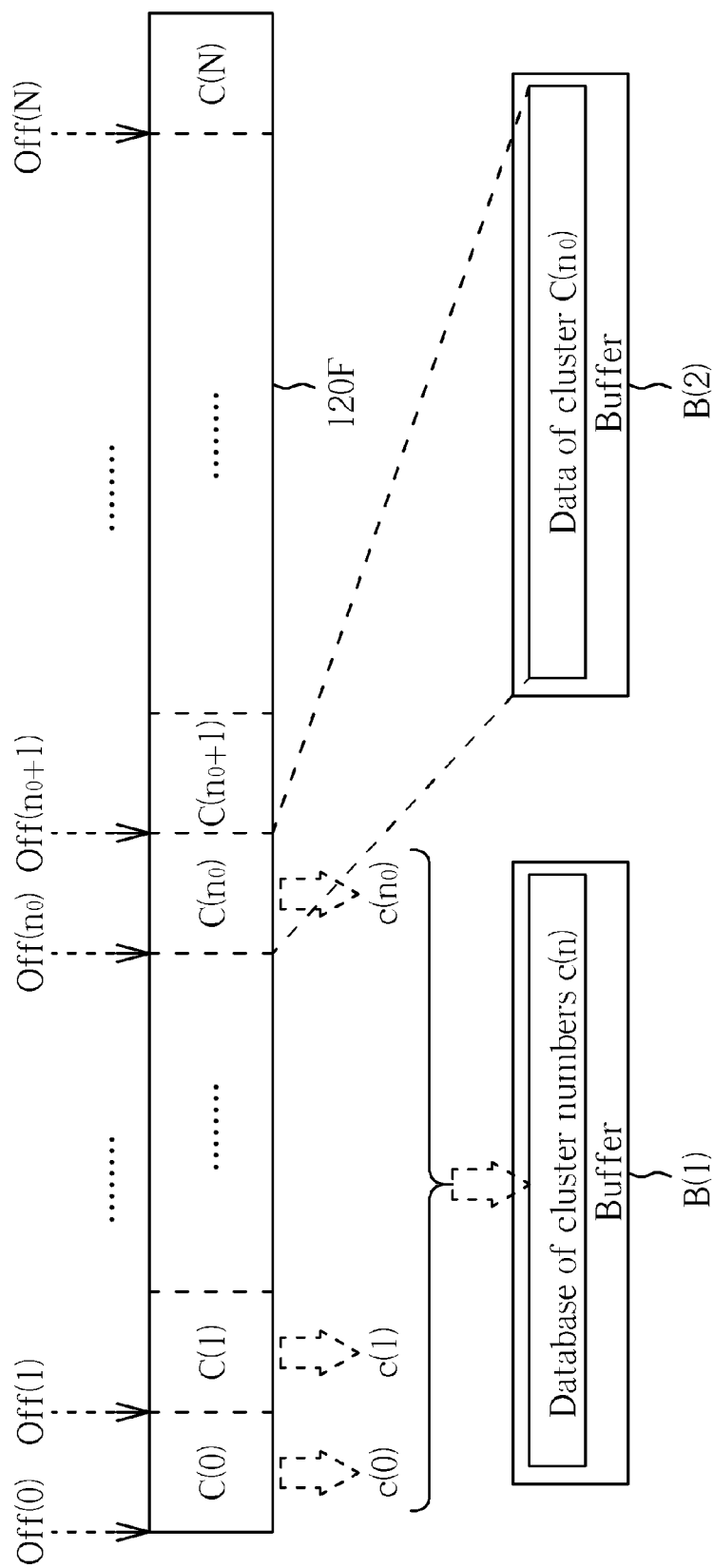
FIGS. 3A-3B illustrate some offsets and corresponding clusters involved with the method shown in FIG. 2 according to different embodiments of the present invention.
Figure 3B:
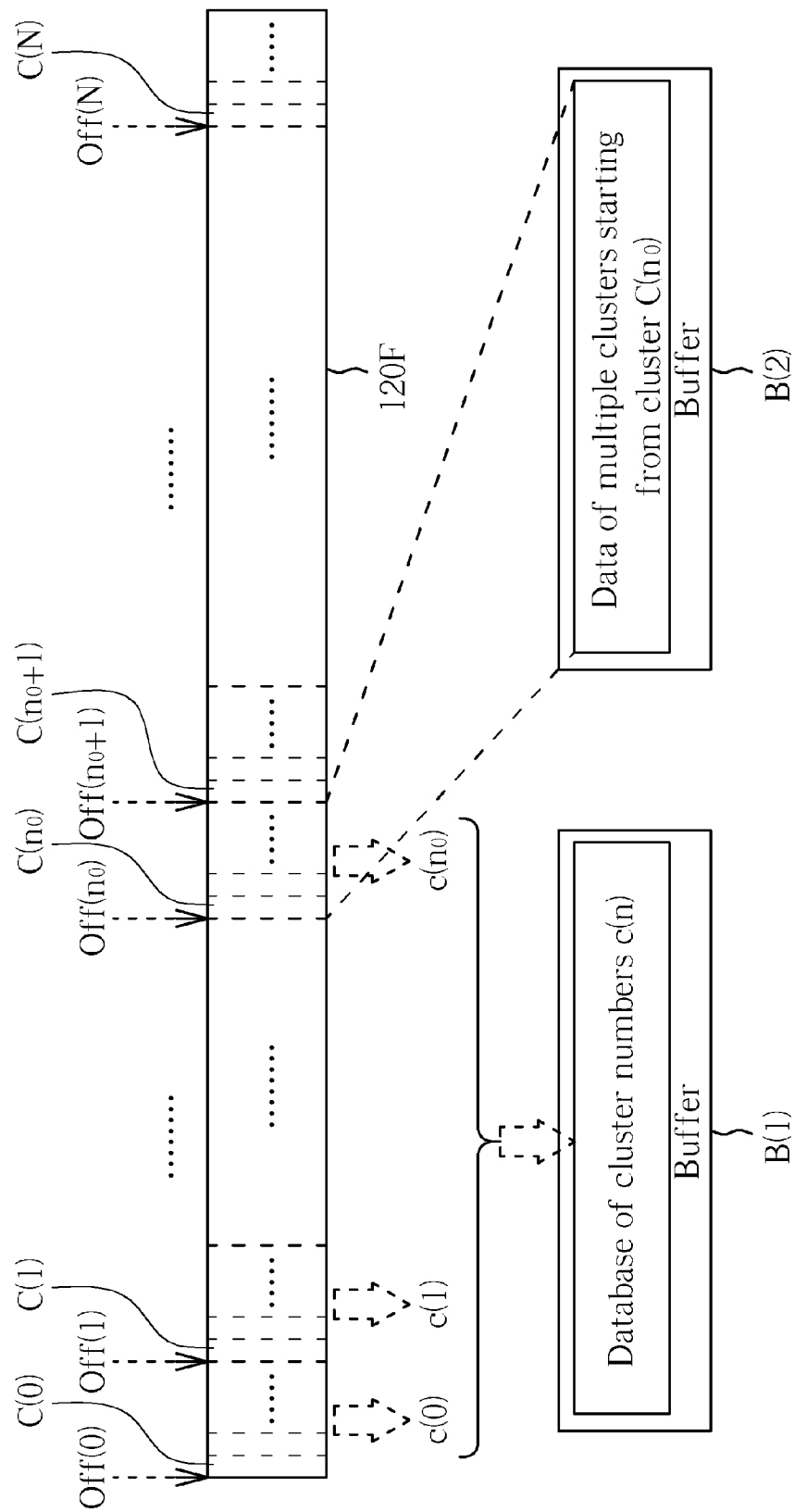

According to a special case of this embodiment, as shown in FIG. 3A, during performing the playback operation or the fast forward operation mentioned above, the controller 110 temporarily stores the clusters $C(0), C(1), \ldots,$ and $C(n_0)$ into the buffer B(2) in turns and also stores the cluster numbers $c(0), c(1), \ldots,$ and $c(n_0)$ with regard to the offsets $Off(0), Off(1), \ldots,$ and $Off(n_0)$, where the size of each cluster (e.g. the currently buffered cluster $C(n_0)$) corresponds to the size of the storage space of the second buffering region/buffer such as the buffer B(2). This is for illustrative purposes only, and is not meant to be a limitation of the present invention. According to another special case of this embodiment, as shown in FIG. 3B, the size of the storage space of the buffer B(2) can be utilized for storing multiple clusters, so during performing the playback operation or the fast forward operation mentioned above, the controller 110 temporarily stores respective sets of clusters that respectively begin with the clusters $C(0), C(1), \ldots,$ and $C(n_0)$ into the buffer B(2) in turns and also stores the cluster numbers $c(0), c(1), \ldots,$ and $c(n_0)$ with regard to the offsets $Off(0), Off(1), \ldots,$ and $Off(n_0)$.

In Step 914, the controller 110 utilizes at least one portion of the offsets Off(n) and the cluster numbers c(n) (e.g. at least one portion of the offsets Off(n) and/or at least one portion of the cluster numbers c(n)) to perform a fast backward operation of the multimedia file 120F. More particularly, the beginning point of the fast backward operation corresponds to a target offset $Off(n_2)$ of the multimedia file 120F. The controller 110 determines whether a cluster $C(n_2)$ corresponding to the target offset $Off(n_2)$ exists within the second buffering region/buffer. For example, in a situation where the cluster $C(n_2)$ corresponding to the target offset $Off(n_2)$ exists within the second buffering region/buffer, the controller 110 reads at least one portion of data belonging to the cluster $C(n_2)$ within the second buffering region/buffer and outputs the aforementioned at least one portion of the data as the output data of the fast backward operation. In another example, in a situation where the cluster $C(n_2)$ corresponding to the target offset $Off(n_2)$ does not exist within the second buffering region/buffer, the controller 110 finds or adds a cluster number $c(n_2)$ of the cluster $C(n_2)$ within the first buffering region/buffer, temporarily stores the cluster $C(n_2)$ into the second buffering region/buffer, and reads at least one portion of data belonging to the cluster $C(n_2)$ within the second buffering region/buffer and outputs the aforementioned at least one portion of the data as the output data of the fast backward operation.

Please note that, in a situation where the multimedia file 120F is a video file, the aforementioned output data of the fast backward operation may represent display data. This is for illustrative purposes only, and is not meant to be a limitation of the present invention. According to some variations of this embodiment, in a situation where the multimedia file 120F is an audio file, the aforementioned output data of the fast backward operation may represent audio data. According to some variations of this embodiment, in a situation where the multimedia file 120F is an audio/video file, the aforementioned output data of the fast backward operation may represent display data and/or audio data.

In practice, the controller 110 determines whether the target offset $Off(n_2)$ is one of the offsets (i.e. the offsets $Off(n)$ involved with the operations of Step 912), and performs associated control operations accordingly. For better comprehension, please refer to the special case shown in FIG. 3A (or FIG. 3B), where the offsets $Off(n)$ involved with the operations of Step 912 are the offsets $Off(0)$, $Off(1)$, ..., and $Off(n_0)$. For example, when the target offset $Off(n_2)$ is one of the offsets such as the offsets $Off(0)$, $Off(1)$, ..., and $Off(n_0)$, the controller 110 looks up for the cluster number $c(n_2)$ of the cluster $C(n_2)$ within the first buffering region/buffer according to the target offset $Off(n_2)$. In another example, when the target offset $Off(n_2)$ is not one of the offsets such as the offsets $Off(0)$, $Off(1)$, ..., and $Off(n_0)$, the controller 110 finds a specific offset of the offsets such as the offsets $Off(0)$, $Off(1)$, ..., and $Off(n_0)$ that is most close to, but not greater than, the target offset $Off(n_2)$, and utilizes the specific offset as a start offset $Off(n_1)$ for performing iteration operations.

More specifically, with regard to a plurality of additional offsets $\{Off(n)|n=n_1, \ldots, n_2\}$ of the multimedia file 120F that start from the start offset $Off(n_1)$ through to the target offset $Off(n_2)$ (e.g. the offsets $Off(n_1)$, $Off(n_1+1)$, ..., and $Off(n_2)$), the controller 110 respectively stores the corresponding cluster numbers $\{c(n)|n=n_1, \ldots, n_2\}$ into the first buffering region/buffer, and also temporarily stores the clusters $\{C(n)|n=n_1, \ldots, n_2\}$ represented by the cluster numbers $\{c(n)|n=n_1, \ldots, n_2\}$ corresponding to the additional offsets $\{Off(n)|n=n_1, \ldots, n_2\}$ into the second buffering region/buffer in turns. As a result, by utilizing the iteration operations disclosed above, when processing the cluster $C(n_2)$ corresponding to the target offset $Off(n_2)$, the controller 110 can start to read at least one portion of data belonging to the cluster $C(n_2)$ within the second buffering region/buffer and output the aforementioned at least one portion of the data as the output data of the fast backward operation. In addition, during the iteration operations mentioned above, the controller 110 automatically expands the database established within the first buffering region/buffer in Step 912.

According to the embodiment shown in FIG. 2, when storing the cluster numbers $c(n)$ into the first buffering region/buffer, the controller 110 can respectively store the offsets $Off(n)$ into the first buffering region/buffer. As a result, according to the offsets $Off(n)$, the controller 110 can look up for the corresponding cluster numbers $c(n)$ thereof. This is for illustrative purposes only, and is not meant to be a limitation of the present invention. According to some variations of this embodiment, the offsets $Off(n)$ may be arranged to have a predetermined distribution (e.g. the offsets $Off(n)$ may form an arithmetic sequence). Thus, in a situation where the offsets $Off(n)$ are not stored in the first buffering region/buffer, the controller 110 can still look up for the corresponding cluster numbers $c(n)$ according to an equation of the predetermined distribution. For example, in a situation where the offsets $Off(n)$ form an arithmetic sequence, the controller 110 can utilize the equation to calculate any offset within the arithmetic sequence. In another example, in a situation where the offsets $Off(n)$ is a sequence of a nonlinear distribution, the controller 110 can utilize the equation to calculate any offset within the sequence of the nonlinear distribution. According to some variations of this embodiment, the sizes of the clusters $C(n)$ are not all the same, and the number of clusters stored in the second buffering region/buffer may varies with respect to time.

Figure 4:
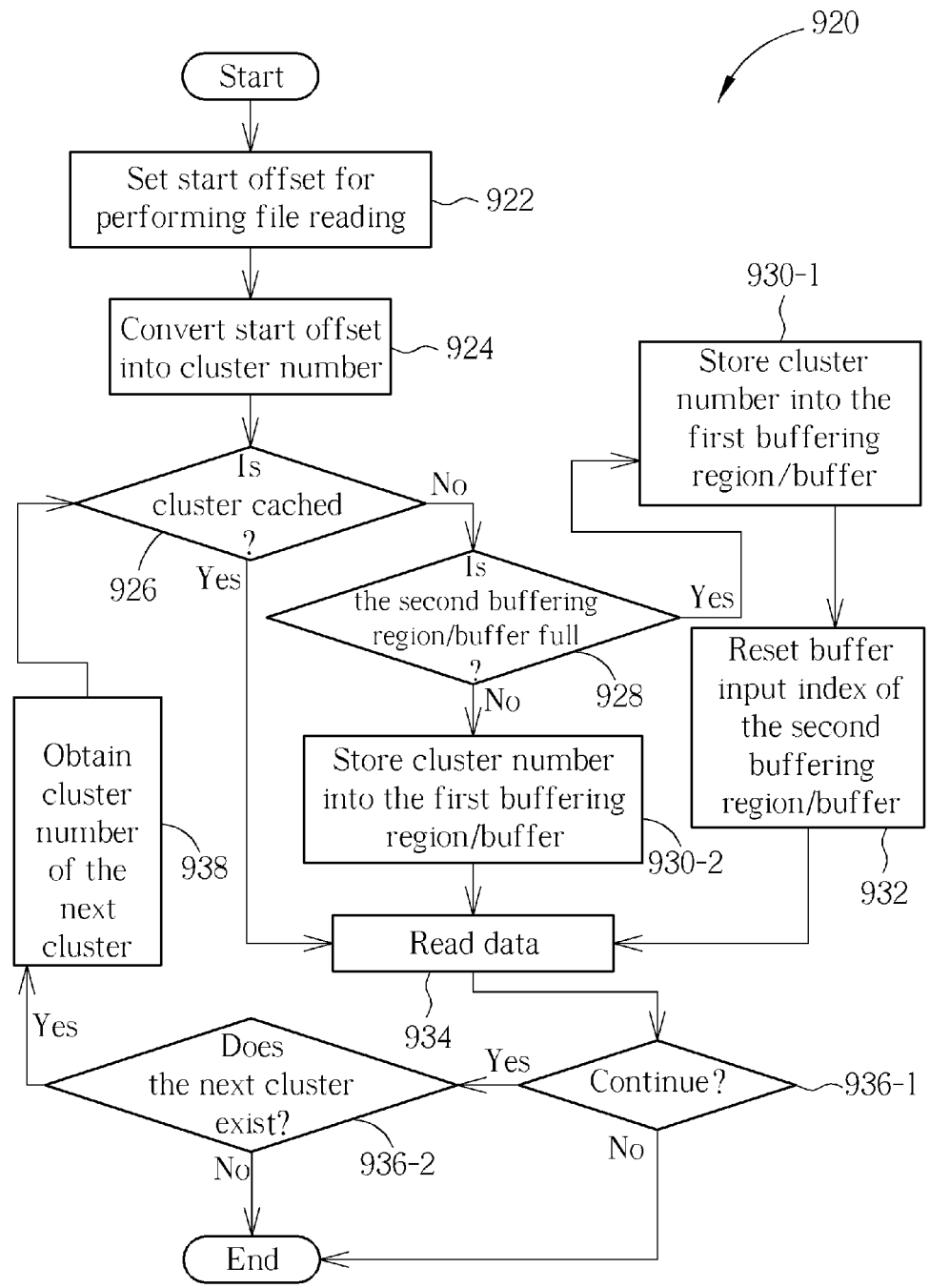
FIG. 4 illustrates some implementation details of the method shown in FIG. 2 according to an embodiment of the present invention.

FIG. 4 illustrates some implementation details of the method 910 shown in FIG. 2 according to an embodiment of the present invention, where the working flow 920 illustrates typical operations of the controller 110 in a "normal mode". Please note that the working flow 920 can be applied to fast backward operations, and can also be applied to playback or fast forward operations. The working flow 920 is described as follows.

In Step 922, the controller 110 sets the start offset $Off(n_1)$ for performing file reading.

In Step 924, the controller 110 converts the start offset $Off(n_1)$ into the cluster number $c(n_1)$.

In Step 926, the controller 110 checks whether the cluster $C(n)$ is cached. In a situation where Step 926 is entered the first time, $n=n_1$, i.e. the cluster $C(n)$ represents the cluster $C(n_1)$ in this situation. When the cluster $C(n)$ is cached, Step 934 is entered; otherwise, Step 928 is entered.

In Step 928, the controller 110 checks whether the second buffering region/buffer such as the buffer B(2) is full. When the second buffering region/buffer is full, Step 930-1 is entered; otherwise, Step 930-2 is entered.

In Step 930-1, the controller 110 stores the cluster number $c(n)$ into the first buffering region/buffer such as the buffer B(1).

In Step 930-2, the controller 110 stores the cluster number $c(n)$ into the first buffering region/buffer such as the buffer B(1).

In Step 932, the controller 110 resets the buffer input index of the second buffering region/buffer. As a result, the controller 110 can re-utilize the second buffering region/buffer and omit the original data that has been temporarily stored in the second buffering region/buffer.

In Step 934, the controller 110 reads data.

In Step 936-1, the controller 110 determines whether to continue. More particularly, n of this embodiment increases during the iteration operations. As a result, when $n<n_2$ (and more specifically, the offset $Off(n)$ is not the target offset $Off(n_2)$ in this situation), Step 936-2 is entered to continue; otherwise, which means $n=n_2$ (i.e. the offset $Off(n)$ is the target offset $Off(n_2)$), the working flow 920 is ended.

In Step 936-2, the controller 110 checks whether the next cluster $C(n+1)$ exists. When the next cluster $C(n+1)$ exists, Step 938 is entered; otherwise, the working flow 920 is ended.

In Step 938, the controller 110 obtains the cluster number $c(n+1)$ of the next cluster $C(n+1)$ to perform the iteration operation corresponding to $(n+1)$. In practice, the controller 110 may increase n with an increment of one, and then, Step 926 is re-entered.

Figure 5:
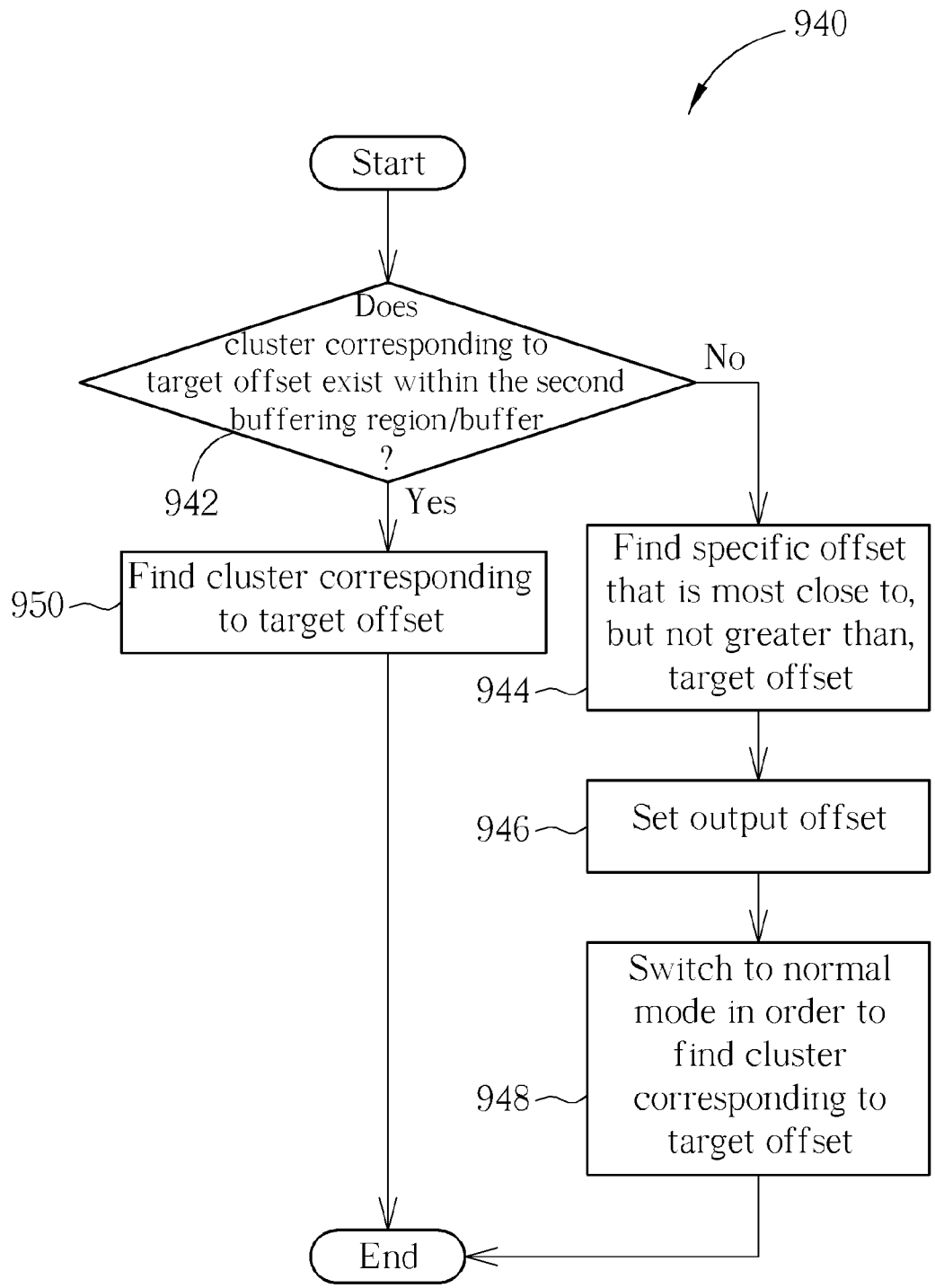
FIG. 5 illustrates some implementation details of the method shown in FIG. 2 according to an embodiment of the present invention.

FIG. 5 illustrates some implementation details of the method 910 shown in FIG. 2 according to an embodiment of the present invention, where the working flow 940 illustrates typical operations of the controller 110 in a "jump mode". Please note that the working flow 940 can be applied to fast backward operations, and can also be applied to playback or fast forward operations. The working flow 940 is described as follows.

In Step 942, the controller 110 checks whether the cluster $C(n_2)$ corresponding to the target offset $Off(n_2)$ exists within the second buffering region/buffer such as the buffer B(2). When the cluster $C(n_2)$ corresponding to the target offset $Off(n_2)$ exists within the second buffering region/buffer, Step 950 is entered; otherwise, the Step 944 is entered.

In Step 944, the controller 110 finds a specific offset that is most close to, but not greater than, the target offset $Off(n_2)$. More particularly, within the offsets $Off(n)$ involved with the operations of Step 912, the controller 110 finds the specific offset that is most close to, but not greater than, the target offset $Off(n_2)$.

In Step 946, the controller 110 sets the output offset. More particularly, the controller 110 sets the specific offset found in Step 944 as the output offset for use in Step 948.

In Step 948, the controller 110 switches to the normal mode in order to find the cluster $C(n_2)$ corresponding to the target offset $Off(n_2)$. More particularly, the controller 110 utilizes the output offset set in Step 946 as the start offset $Off(n_1)$ of the working flow 920 and executes the working flow 920.

In Step 950, the controller 110 finds the cluster $C(n_2)$ corresponding to the target offset $Off(n_2)$.

It is an advantage of the present invention that the present invention can enhance fast backward performance of electronic devices, and can also give consideration to both operation performance and system resource management. More particularly, the present invention can save the total buffering space of the buffering regions/buffers, where the related art problems such as the need of a large storage space for buffering, additional power consumption due to many additional read operations, etc. will never occur. Therefore, the present invention method and the associated electronic device can provide extremely high performance.

Those skilled in the art will readily observe that numerous modifications and alterations of the device and method may be made while retaining the teachings of the invention.

What is claimed is:

1. A method for enhancing fast backward performance, the method comprising:
    during a playback or fast forward operation, with regard to a plurality of offsets of a multimedia file, temporarily storing part of a plurality of cluster numbers which respectively correspond to part of the plurality of offsets into a first buffering region/buffer, rotating each cluster of the plurality of clusters in and out of a second buffering region/buffer according to capacity of the second buffering region/buffer such that it is replaced by another cluster of the plurality of clusters, so that each cluster is only stored temporarily in the second buffering region/buffer, and rotating each corresponding cluster number in and out of the first buffering region/buffer accordingly, wherein the cluster numbers respectively represent a plurality of clusters belonging to the multimedia file, and the offsets respectively correspond to different playback time points of the plurality of clusters; and
    utilizing at least one portion of the offsets and the cluster numbers to perform a fast backward operation of the multimedia file, comprising:
        determining whether a cluster corresponding to a target offset exists within the second buffering region/buffer; and
        in a situation where the cluster corresponding to the target offset does not exist within the second buffering region/buffer, determining whether the target offset is one of the offsets, when the target offset is not one of the offsets, finding a specific offset of the offsets that is most close to, but not greater than, the target offset and utilizing the specific offset as a start offset, and with regard to a plurality of additional offsets of the multimedia file that start from the start offset through to the target offset, respectively storing corresponding cluster numbers into the first buffering region/buffer and temporarily storing clusters represented by the cluster numbers corresponding to the additional offsets into the second buffering region/buffer in turns, and reading at least one portion of data belonging to the clusters within the second buffering region/buffer and outputting the at least one portion of the data as output data of the fast backward operation;
    wherein the offsets are not stored with the cluster numbers.

2. The method of claim 1, wherein the step of utilizing the at least one portion of the offsets and the cluster numbers to perform the fast backward operation of the multimedia file further comprises:
    determining whether a cluster corresponding to a target offset exists within the second buffering region/buffer; and
    in a situation where the cluster corresponding to the target offset exists within the second buffering region/buffer, reading at least one portion of data belonging to the cluster within the second buffering region/buffer and outputting the at least one portion of the data as output data of the fast backward operation.

3. The method of claim 1, wherein a size of each cluster corresponds to a size of storage space of the second buffering region/buffer.

4. The method of claim 1, wherein the step of temporarily storing part of the plurality of cluster numbers which respectively correspond to part of the plurality of offsets into the first buffering region/buffer further comprises:
    during performing the fast forward operation or playback operation of the multimedia file, with regard to the offsets, temporarily storing the corresponding cluster numbers into the first buffering region/buffer.

5. The method of claim 1, wherein the step of temporarily storing part of the plurality of cluster numbers which respectively correspond to part of the plurality of offsets into the first buffering region/buffer further comprises:
    temporarily storing the offsets into the first buffering region/buffer.

6. An electronic device, comprising:
    at least one buffer memory device comprising a first buffering region/buffer and a second buffering region/buffer; and
    a controller arranged to execute a program code to control operations of the electronic device, wherein during a playback or fast forward operation and with regard to a plurality of offsets of a multimedia file, the controller temporarily stores part of a plurality of cluster numbers respectively corresponding to part of the plurality of offsets into the first buffering region/buffer, and rotates each cluster of the plurality of clusters in and out of the second buffering region/buffer according to capacity of the second buffering region/buffer such that it is replaced by another cluster of the plurality of clusters, so that each cluster is only temporarily stored in the second buffering region/buffer, and rotates each cluster number in and out of the first buffering region/buffer correspondingly;

wherein the cluster numbers respectively represent a plurality of clusters belonging to the multimedia file, the offsets respectively correspond to different playback time points of the plurality of clusters, the offsets are not stored with the cluster numbers; and the controller utilizes at least one portion of the offsets and the cluster numbers to perform a fast backward operation of the multimedia file;

wherein the controller determines whether a cluster corresponding to a target offset exists within the second buffering region/buffer; and in a situation where the cluster corresponding to the target offset does not exist within the second buffering region/buffer, the controller determines whether the target offset is one of the offsets, when the target offset is not one of the offsets, the controller finds a specific offset of the offsets that is most close to, but not greater than, the target offset, and utilizes the specific offset as a start offset, and with regard to a plurality of additional offsets of the multimedia file that start from the start offset through to the target offset, the controller respectively stores corresponding cluster numbers into the first buffering region/buffer and temporarily stores clusters represented by the cluster numbers corresponding to the additional offsets into the second buffering region/buffer in turns, and reads at least one portion of data belonging to the clusters within the second buffering region/buffer and outputs the at least one portion of the data as output data of the fast backward operation.

7. The electronic device of claim 6, wherein the controller determines whether a cluster corresponding to a target offset exists within the second buffering region/buffer; and in a situation where the cluster corresponding to the target offset exists within the second buffering region/buffer, the controller reads at least one portion of data belonging to the cluster within the second buffering region/buffer and outputs the at least one portion of the data as output data of the fast backward operation.

8. The electronic device of claim 6, wherein a size of each cluster corresponds to a size of storage space of the second buffering region/buffer.

9. The electronic device of claim 6, wherein during performing the fast forward operation or playback operation of the multimedia file, with regard to the offsets, the controller respectively temporarily stores the corresponding cluster numbers into the first buffering region/buffer.

10. The electronic device of claim 6, wherein the controller respectively temporarily stores the offsets into the first buffering region/buffer.

* * * * *